United States Patent [19]
Yoshida et al.

[11] Patent Number: 5,536,364
[45] Date of Patent: Jul. 16, 1996

[54] PROCESS OF PLASMA ETCHING SILICON

[75] Inventors: Takahiko Yoshida; Kazushi Asami, both of Okazaki; Muneo Yorinaga, Anjo; Yoshimi Yoshino, Inuyama, all of Japan

[73] Assignees: Nippon Soken, Inc., Nishio; Nippondenso Co., Ltd., Kariya, both of Japan

[21] Appl. No.: 253,704

[22] Filed: Jun. 3, 1994

[30] Foreign Application Priority Data

Jun. 4, 1993 [JP] Japan .................................. 5-160320

[51] Int. Cl.⁶ .................................. H01L 21/3065
[52] U.S. Cl. .................... 156/643.1; 156/646.1; 156/659.11; 156/662.1
[58] Field of Search ................. 156/643.1, 646.1, 156/659.11, 662.1, 657.1, 653.1

[56] References Cited

U.S. PATENT DOCUMENTS

| | | |
|---|---|---|
| 4,380,489 | 4/1983 | Beinvogl et al. .................. 156/643 |
| 4,595,453 | 6/1986 | Yamazaki et al. .................. 156/643 |
| 4,741,799 | 5/1988 | Chen et al. .................. 156/643 |
| 4,886,569 | 12/1989 | Ojha et al. .................. 156/643 |
| 5,094,712 | 3/1992 | Becker et al. .................. 156/643 |

FOREIGN PATENT DOCUMENTS 55-165636  12/1980  Japan .
2275626  11/1990  Japan .

*Primary Examiner*—Thi Dang
*Attorney, Agent, or Firm*—Cushman, darby & Cushman

[57] ABSTRACT

A plasma etching process for forming a recess or opening on a silicon substrate by generating plasma between a pair of electrodes in an anode-coupled planar-type plasma etching apparatus and etching the silicon substrate located on one of the electrodes with the plasma, an improvement residing in that an etchant is a mixed gas of sulfur hexafluoride and oxygen and an etching mask covering the substrate, except for a portion where the recess or opening is to be formed, is made of chromium or a chromium compound. Preferably the distance between the electrodes is 10 to 30 mm, the volume ratio of sulfur hexafluoride to oxygen is 90:10 to 60:40, the pressure of the etchant gas is 0.15 to 0.4 Torr (20 to 53 Pa), and the temperature of the substrate is not less than 40° C.

6 Claims, 5 Drawing Sheets

PROCESS OF PLASMA ETCHING SILICON

BACKGROUND OF THE INVENTION

1. Field of the Invention

The present invention relates to a process for radio frequency plasma etching, and more specifically to a process for etching a silicon substrate with plasma generated by a radio frequency discharge to form a recess or opening on a surface of the substrate in the fabrication of a micro-processed silicon device.

2. Description of the Related Art

When fabricating micro-processed silicon devices, such as pressure sensors, a technology for etching a substrate vertically and deeply is essential in order to form a recess used for detecting a variation in pressure or for element isolation or to form an opening for making a electrical contact between conductive layers.

Conventionally known technologies for forming a recess or opening include a wet etching process using a reactive solution such as potassium hydroxide and a plasma etching process, particularly a reactive ion etching process using a plasma containing ions of a reaction gas.

In wet etching, it is difficult to control the angle of the side wall of a recess or vertical opening. This is due to the fact that the etching rate varies depending on the plane orientation of the silicon. As the diameter of the silicon wafer, the thickness of the silicon wafer, and thus the amount of the silicon wafer to be etched increases, it becomes more difficult to the shape of an etched portion. For example, the etched portion has a tapered shape along the crystallographic plane due to the reasons discussed above. As a result, the size of a sensor, etc. has to be made larger more than necessary.

In contrast, in plasma etching, the etching rate does not depend on the plane orientation of a. In addition, plasma etching has an etching rate that is equal to or higher than that of the wet etching. The etching rate for a single silicon by dry etching is around 2 μm/min. Nevertheless, the plasma etching does not permit batch treatment of a large number of wafers and thus the treatment efficiency is inferior.

In dry etching, the etching rate may be increased by increasing the supplied power, the pressure of a reaction gas or the flow rate of a reaction gas or by heating the substrate, but these operations simultaneously increase the side etching, to make the side wall of the etched portion more tapered, and a vertical side wall can not be obtained. Moreover, an increase in the ion energy simultaneously increases damage to the etching surface of the substrate and the problem of surface roughness arises. Moreover, in the case of deep etching, a mask material, such as aluminum, having a high etching selectivity to silicon becomes necessary due to the large amount of. However, the mask material, when etched at a high ion energy, may be sputtered and scattered again (re-deposited) onto the substrate to increase the surface roughness. Accordingly, in practice, it is necessary to adopt conditions in dry etching to obtain a vertical shape and a less roughened surface, and an enormously long time is required in fabricating a sensor or the like involving deep etching.

SUMMARY OF AN INVENTION

The object of the invention is to provide a plasma etching process which has a high etching rate, allows a recess or opening to have a vertical sectional profile and provides a low surface roughness so that it can be used to fabricate a sensor or the like that requires deep etching.

In order to attain the above object, the present invention provides a plasma etching process for forming a recess or opening on a silicon substrate by generating plasma between a pair of electrodes in an anode-coupled planar-type plasma etching apparatus and etching the silicon substrate placed over one of the electrodes with the plasma, in which an improvement resides in that an etchant is a mixed gas of sulfur hexafluoride and oxygen and an etching mask covering the substrate except for a portion where the recess or opening is to be formed is made of chromium or a chromium compound.

Preferably, the electrodes are spaced apart by a distance of 10 to 30 mm, the volume ratio of the sulfur hexafluoride to oxygen in the mixed gas is in a range of 90:10 to 60:40, the etchant gas is kept at a pressure in a range of 0.15 to 0.4 Torr (20 to 53Pa), and the substrate is kept at a temperature of not less than 40° C.

A reaction gas comprising sulfur hexafluoride and oxygen is disassociated by radio frequency power and the generated ions and radicals proceed the etching. In the anode coupling-type system, the etching progresses isotropically but, in the present invention, the etched shape becomes vertical because an ion-assist effect operates and the etching profile becomes anisotropic due to a short distance between the electrodes (as shown in FIG. 4). Furthermore, as a result, in accordance with the present invention, it is possible to make the etching rate higher than that of a usual anode coupled-type system, while maintaining the vertical etching profile.

In the anode coupled-type system, damage or roughness of the etched surface of a substrate is reduced, but the ion assist effect mentioned above causes sputtering and diffusion of a mask material in a space between the electrodes. This diffused mask material reacts with the reaction gas to form a compound, which again deposits on the etched surface of the substrate and acts as a number of micro-masks, causing surface roughness. In the present invention, however, the chromium or chromium compound used as a mask material forms chromium fluoride or chromium fluoroxide ($CrO_xF_y$) with the reaction gas and the proportion of the chromium fluoroxide in the deposited chromium compound is higher under the conditions adopted in the present invention. Here, the vapor pressure of chromium fluoroxide is higher than that of chromium fluoride, which means that the deposited chromium compound comprising a high content of the chromium fluoroxide tends to easily evaporate. As a result, deposition of a compound, acting as micro-masks, is reduced and the surface roughness is prevented in the present invention.

DESCRIPTION OF THE PREFERRED EMBODIMENTS

Figure 1:
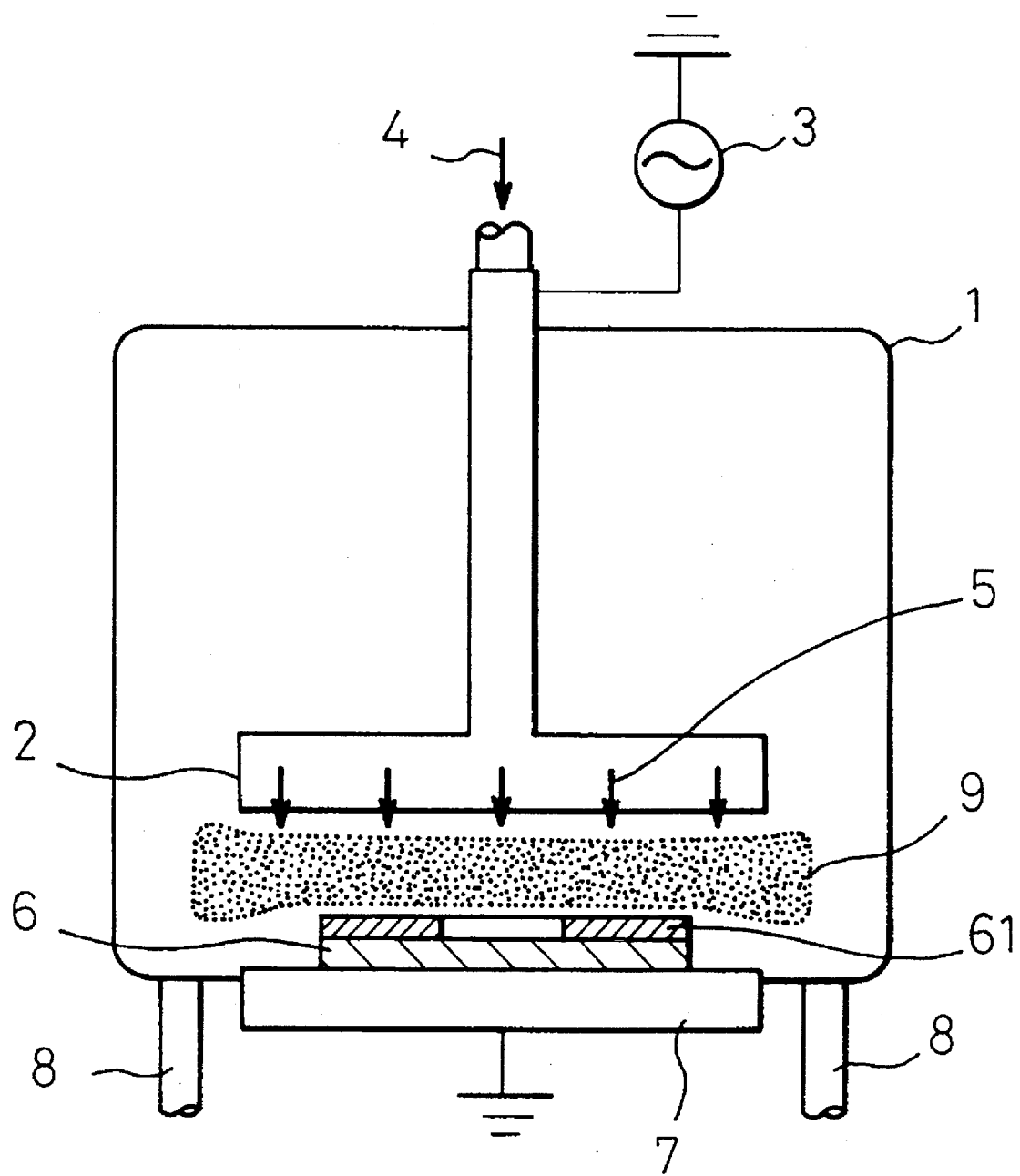
FIG. 1 is a sectional view of an anode-coupled planar-type dry etching apparatus according to the present invention.

FIG. 1 shows an anode-coupled planar-type dry etching apparatus used in the present invention. In a reaction chamber 1, an electrode 2 for applying a radio frequency power is arranged and a radio frequency power is applied to the electrode 2 from a radio frequency power source 3. A reaction gas inlet 4 is provided above the electrode 2 and a reaction gas 5 is introduced through the reaction gas inlet 4 into the reaction chamber 1 and blown out through nozzles on the bottom of the electrode 2.

A silicon substrate 6 to be etched is arranged facing the electrode 2 and supported by an electrode 7 from the bottom thereof and the silicon substrate 6 is grounded through the electrode 7. The temperature of the electrode 7 can be controlled so that the temperature of the silicon substrate 6 is kept constant. The silicon substrate 6 is, for example, a single crystal silicon and is provided with an etching mask 61 of chromium or a chromium compound over the surface of the substrate 6, except for portions where a recess or opening is to be formed. The reaction chamber 1 is provided with reaction gas exits 8 through which the chamber 1 is evacuated to maintain a certain pressure therein.

The reaction gas is a mixed gas of sulfur hexafluoride ($SF_6$) and oxygen ($O_2$). The reaction gas, after passing through a flow rate control device (not shown), is introduced in the reaction chamber 1 where high frequency power is applied to the reaction gas to generate plasma 9. The exposed portion of the silicon substrate 6 where a recess or opening is to be formed, on the one hand, and reactive species or reaction gas ions in the plasma, on the other hand, physical-chemically react with each other, to thereby etch and remove the portion of the silicon to be processed. It is desirable that the flow rate of the reaction gas is 2 sccm or more per liter of reaction chamber volume and the applied power is 1 $W/cm^2$ or more per unit area of the electrode.

Various conditions for plasma etching using the above apparatus have been investigated.

1) Effect of composition of reaction gas

Figure 2:
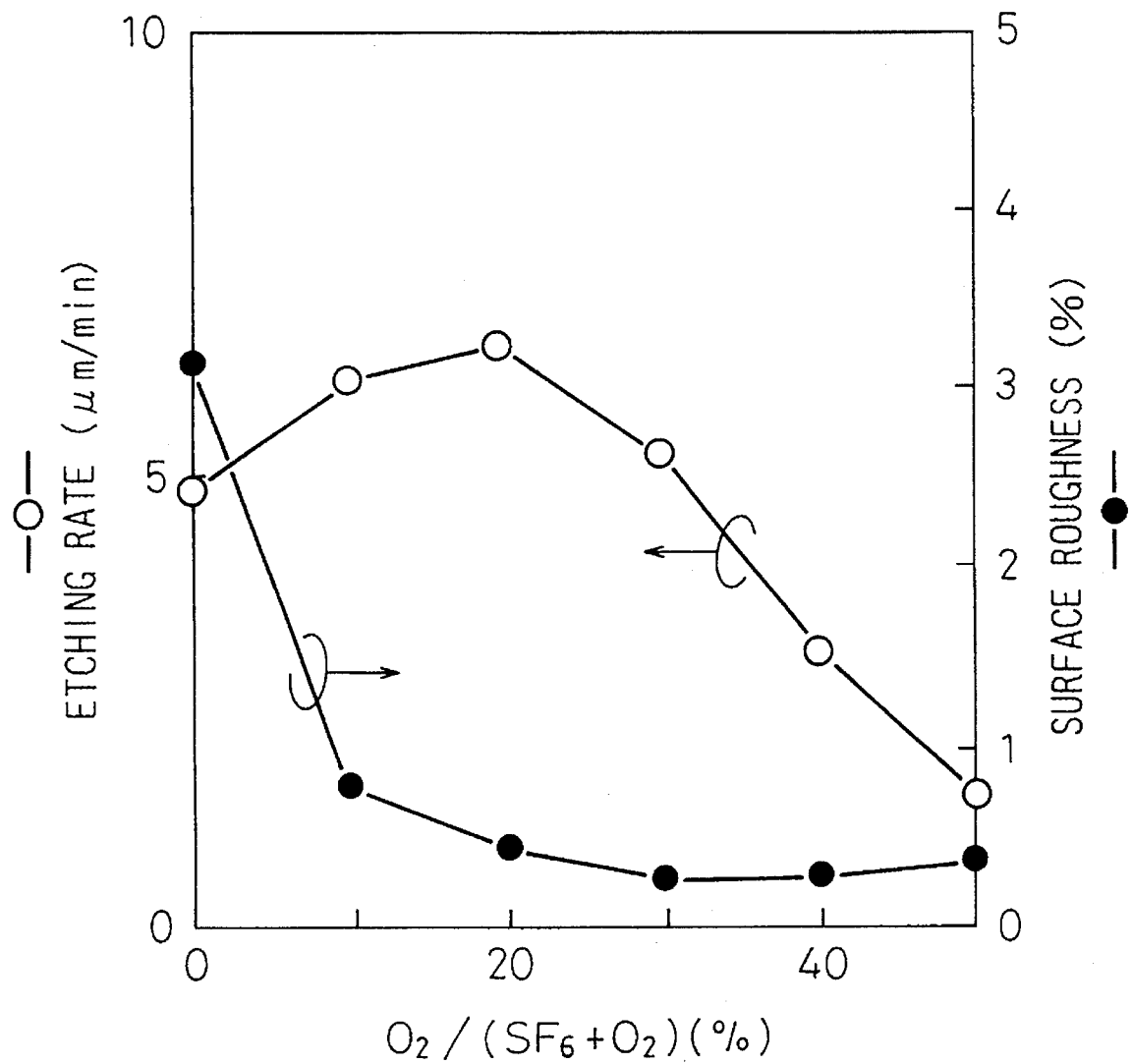
FIG. 2 shows the etching rate and the surface roughness in relation to the ratio of oxygen in a reaction gas.

FIG. 2 shows the etching rate and the surface roughness in relation to the mixing ratio of sulfur hexafluoride and oxygen. In FIG. 2, the surface roughness is a value normalized by dividing the maximum roughness of the etched surface by the depth of the etching. The etching conditions were a gas pressure of 0.2 Torr, a total gas flow rate of 100 sccm (10 sccm per 1 liter of reaction chamber), an applied electric power of 500 W (1.3 $W/cm^2$ per unit area of electrode), a distance between the electrodes of 15 mm and a temperature of the substrate of 60°.

FIG. 2 shows that the etching rate increases with an increase in the ratio of oxygen but falls when the ratio of oxygen exceeds a certain level (see the white circles in FIG. 2). This is due to the fact that, when the amount of the oxygen continues to increase, the concentration of the fluorine radical which contributes to etching is lowered by the dilution with the oxygen, and the an oxygen layer chemically adsorbed on the surface of the etching substrate lowers the etching effect of the fluorine radical.

The surface roughness of the substrate is reduced with an increase of the concentration of the oxygen in the reaction gas (see the black circles in FIG. 2). The surface roughness is caused by redeposition of a chromium compound formed by reaction between the sputtered mask material and the reaction gas. As the concentration of the oxygen increases, the ratio of the chromium fluoroxide having a high vapor pressure increases and the re-deposited chromium compound is easily evaporated, to thereby reduce the surface roughness. When the amount of oxygen exceeds a certain level, an oxygen layer chemically adsorbed on the surface of the substrate becomes non-uniform, so that the etching rate varies locally to increase the surface roughness. Thus, in order to obtain both effects of a high etching rate and a low surface roughness, it is preferred that the ratio of $SF_6$ to $O_2$ in the reaction gas is between 90:10 and 60:40 by volume.

2) Effect of pressure of etching gas

Figure 3:
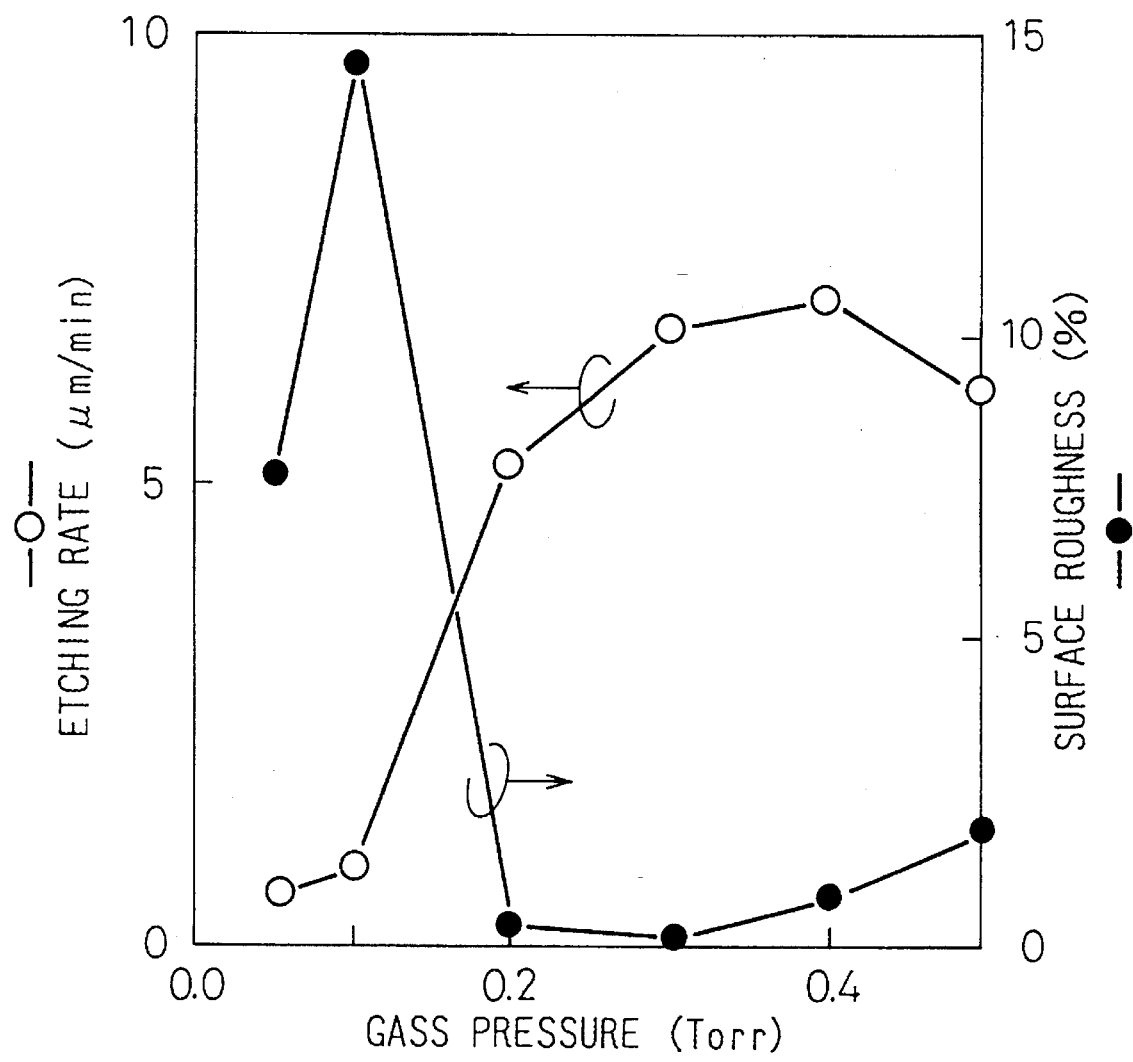
FIG. 3 shows the etching rate and the surface roughness in relation to the pressure of a reaction gas.

FIG. 3 shows the etching rate and the surface roughness in relation to the pressure of the reaction gas. The conditions of etching were a total gas flow rate of 100 sccm, a ratio of $SF_6$ to $O_2$ in the reaction gas of 70:30, an electric power of 500 W, a distance between electrodes of 15 mm, and a temperature of substrate of 60° C.

FIG. 3 shows that the etching rate increases and is likely to be saturated as the pressure of the gas increases (see the white circles in FIG. 3). The surface roughness first lowers and, from 0.2 Torr and on, exhibits an almost constant value as the pressure of the gas increases (see the black circles in FIG. 3). This largely relates to the fact that an increase in the pressure of the gas results in a shortening of the mean free path of particles in the plasma, increasing the chance of collision of the particles and lowering the kinetic energy of the particles, so that the probability of sputtering the etching surface or the mask is remarkably lowered. When the pressure of the gas exceeds 0.4 Torr, the etching rate again falls and the surface roughness may increase. Thus, in order to obtain the effects of a high etching rate and of a low surface roughness, it is preferred that the pressure of the gas is set in a range of 0.15 to 0.4 Torr (20 to 53Pa).

3) Effect of distant between electrodes

Figure 4A:
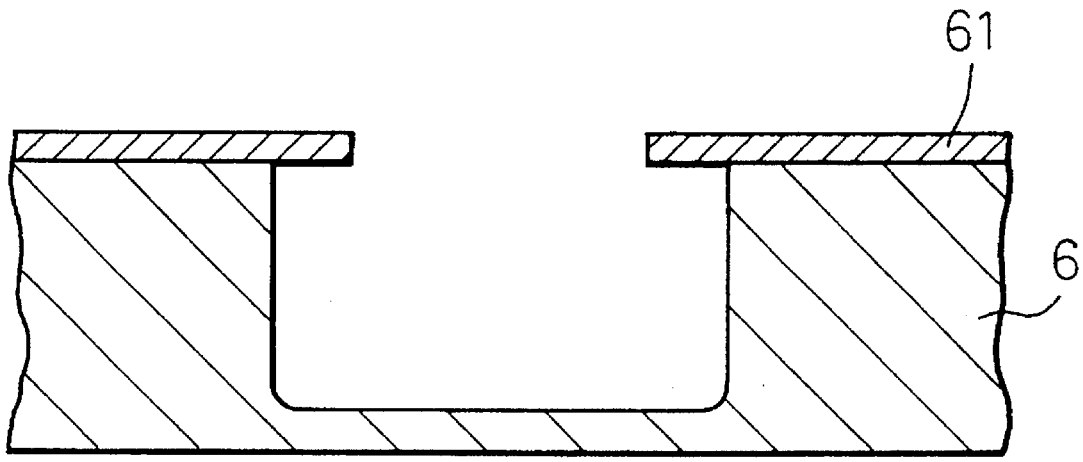
FIGS. 4A and 4B show cross-sectional views of devices etched under the conditions of short and long distances between electrodes.
Figure 4B:
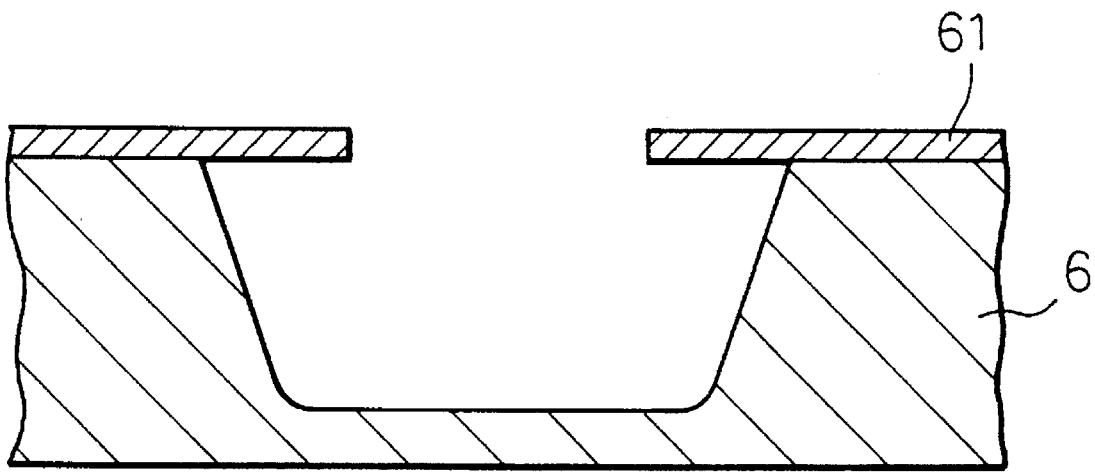

In a conventional anode coupled-type etching, the etching proceeds isotropically. In the anode coupled-type etching according to the present invention, the distance between the electrodes is reduced so that an ion-assist effect is obtained to thereby accelerate the etching and make vertical etching possible. Because the energy of the ion-assist effect in the anode coupled-type etching according to the present invention is not as high as that obtained in cathode-coupled etching when the same electric power is applied, damage to the etching substrate, and thus the surface roughness, are reduced, but the energy is sufficient to make the sectional etching profile vertical. For example, when etching was conducted under the conditions of a distance between the electrodes of 15 mm, a ratio of $SF_6$ to $O_2$ in the reaction gas of 70:30, a pressure of the gas of 0.2 Torr, a total gas flow rate of 100 sccm, an electric power of 500 W and a temperature of substrate of 60° C., a vertical sectional etching profile was obtained as shown in FIG. 4A. In contrast, when the distance between the electrodes was 70 mm and the other conditions were the same as the above, a highly tapered sectional etching profile was obtained as shown in FIG. 4B. Accordingly, in order to obtain a vertical sectional etching profile (as shown in FIG. 4A) as required in a pressure sensor, it is preferred that the distance between the electrodes is in a range from 10 to 30 mm.

4) Effect of temperature of substrate

Figure 5:
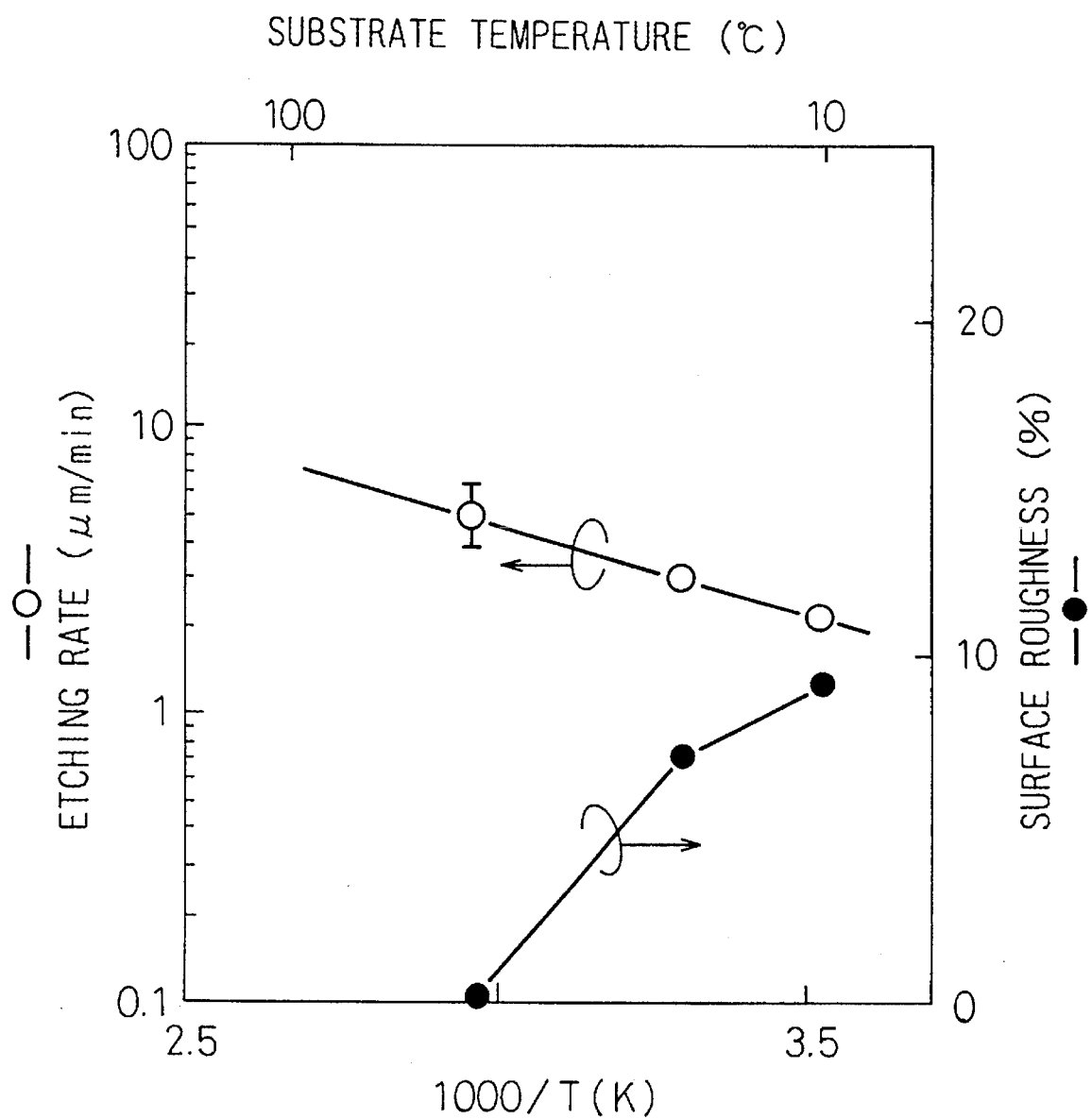
FIG. 5 shows the etching rate and the surface roughness in relation to the temperature of a substrate.

FIG. 5 shows the etching rate and the surface roughness in relation to the temperature of the substrate, which were measured by varying the temperature of the substrate 6 in the apparatus shown in FIG. 1. The conditions of the etching were a total gas flow rate of 100 sccm, a ratio of $SF_6$ to $O_2$ in the reaction gas of 70:30, a pressure of the gas of 0.3 Torr, an electric power of 500 W and a distance between the electrodes of 15 mm. FIG. 5 shows that the etching rate increases (see the white circles) and the surface roughness is reduced (see the black circles) as the temperature of the substrate raises. This is because an elevation of the temperature of the substrate accelerates evaporation of the product of the reaction between silicon and the fluorine radical. The chromium compound deposited on the etching substrate by decomposition of the reaction product or sputtering of the mask material also evaporates more quickly with an elevation of the temperature of the substrate, thus preventing the formation of micro-masks or the surface roughness. Specifically, the temperature of the substrate of not less than 40° C. is preferred in order to conduct etching with a high etching rate and a reduced surface roughness.

5) Effect of etching mask material

In order to reduce the surface roughness of the etching surface, it is necessary that any product of the reaction between a mask material and a reaction gas, which redeposits on the etching surface, evaporates easily. The evaporation characteristic of the reaction product re-deposited on the etching surface is different depending on the material of the mask and this difference results in a difference of the surface roughness. While the mask material was varied and the conditions of etching were kept at a flow rate of the total gas of 100 sccm, a ratio of $SF_6$ to $O_2$ in the reaction gas of 70:30, a pressure of the gas of 0.2 Torr, an electric power of 500 W, a distance between the electrodes of 15 mm and a temperature of the substrate of 65° C., etching was conducted and the effect of the mask material to the surface roughness was investigated. The results are shown in the following table.

TABLE

| Mask Material | Etching rate (μm/min) | Surface roughness (%) | Selectivity of etching to silicon |
| --- | --- | --- | --- |
| Chromium | 6.8 | 0.13 | 200 |
| Aluminum | 5.3 | 10.5 | 300 or more |
| Silicon oxide | 6.5 | 0.10 | 30 |

As shown in the table, when silicon oxide is used as the mask material, the surface roughness is relatively low because the reaction product re-deposited on the etching surface evaporates relatively easily but the etching selectivity to silicon, necessary for the etching mask, is as low as 30. When aluminum is used as the mask material, the etching selectivity to silicon is very high, for example 300 or more for example, but the aluminum fluoride compound re-deposited on the etching surface has a very low vapor pressure so that local masks are formed and the surface roughness increases. By raising the temperature of the substrate, it is possible to make the aluminum fluoride compound easily evaporate and lower the surface roughness, but the etching selectivity to silicon as the mask is lowered and the high temperature may cause damage to the substrate, particularly to a circuit involved on the back side of the substrate being etched, if present. In contrast, when chromium is used as the mask material, a chromium compound as the reaction product evaporates at a relatively low temperature so that the surface roughness and damage to the substrate are less and the selectivity to silicon as a mask is as high as about 200. These effects can be obtained even if the chromium layer is deposited by sputtering, evaporation or the like. Thus, by using chromium or a chromium compound as the mask material and the etching conditions according to the present invention, the etching rate and the surface roughness can be improved.

In accordance with the present invention, the etching rate can be improved while the etching sectional profile can be made vertical by using an anode-coupled type etching method and by making the distance between the electrodes small. By using chromium or a chromium compound as the mask material and controlling the etching conditions such as the etching gas composition, the gas pressure, the substrate temperature and/or the like, roughness of the etching surface can be prevented and the mirror polished surface of the substrate present prior to the etching can be maintained after the etching. Accordingly, the etching process of the present invention is adequate for a deep etching with a vertical sectional profile and a less surface roughness, required in, for example, a pressure sensor and the like, in which case the size of the sensor, etc. can be made smaller and the silicon wafer be utilized more efficiently in comparison with the wet etching.

We claim:

1. A plasma etching process for forming a recess in a silicon substrate, comprising:

generating plasma between a pair of electrodes in an anode-coupled planar-type plasma etching apparatus;

providing an etching mask covering said silicon substrate except for a portion of said silicon substrate where said recess is to be formed, said etching mask being made of one of chromium and a chromium compound; and etching said silicon substrate arranged on one of said electrodes with said plasma, wherein an etchant gas is a mixed gas of sulfur hexaflouride and oxygen, a volume ratio of said sulfur hexaflouride to said oxygen is in a range from 90:10 to 70:30, said etchant gas is kept at a pressure in a range from 0.15 to 0.4 Torr, and said substrate is kept at a temperature of not less than 40° C.

2. A process according to claim 1, wherein a pressure of said etchant gas is maintained at less than 53 Pa.

3. A process according to claim 1, wherein a temperature of said substrate is kept greater than 60° C.

4. A plasma etching process for forming a recess in a silicon substrate, comprising:

generating plasma between a pair of electrodes in an anode-coupled planar-type plasma etching apparatus;

providing an etching mask covering said substrate except for a portion where said recess is to be formed, said etching mask being made of one of chromium and a chromium compound; and etching said silicon substrate arranged on one of said electrodes with said plasma, wherein an etchant gas is a mixed gas of sulfur hexaflouride and oxygen, said etchant gas is kept at a pressure in a range from 0.15 to 0.4 Torr, said electrodes are arranged with a distance therebetween of 10 to 30 mm, a volume ratio of said sulfur hexaflouride to said oxygen is in a range from 90:10 to 60:40, and said substrate is kept at a temperature of not less than 40° C.

5. A process according to claim 4, wherein a pressure of said etchant gas is maintained at less than 53 Pa.

6. A process according to claim 4, wherein a temperature of said substrate is kept greater than 60° C.

* * * * *